United States Patent [19]

Moore

[11] 3,953,919
[45] May 4, 1976

[54] METHOD OF MANUFACTURING SEMI-CONDUCTOR DEVICES

[75] Inventor: Alan Raymond Moore, Aldridge, England

[73] Assignee: The Lucas Electrical Company Limited, Birmingham, England

[22] Filed: Dec. 30, 1974

[21] Appl. No.: 537,339

[30] Foreign Application Priority Data
Jan. 18, 1974 United Kingdom............... 2541/74

[52] U.S. Cl.................................. 29/583; 29/590; 83/7; 156/6; 156/17
[51] Int. Cl.².................. B01J 17/00; H01L 7/66
[58] Field of Search............ 29/583, 590, 413, 414, 29/417; 156/6, 8, 11, 12, 17; 83/1, 4, 5, 6, 7

[56] References Cited
UNITED STATES PATENTS

| 3,496,617 | 2/1970 | Cook et al........................ 29/583 X |
|-----------|--------|---------------------------------------------|
| 3,497,948 | 3/1970 | Wiesler et al..................... 29/583 |
| 3,596,348 | 8/1971 | Stacey et al. .................... 29/583 |
| 3,677,875 | 7/1972 | Althouse.......................... 29/583 X |

Primary Examiner—Victor A. DiPalma

[57] ABSTRACT

To manufacture semi-conductor devices an etchant resistant material is applied to the major surfaces of a semi-conductor wafer having at least one n-type zone and at least one p-type zone. The wafer is then divided into individual devices by sawing or scribing part of the way through the wafer and then cracking the wafer along the grooves defined by the sawing or scribing operation, p-n junctions being exposed at the divided edges of the devices. The devices are then mounted on an etchant resistant, adhesive tape with one major surface of each device being presented to the tape, and the tape, with the devices carried thereby, is immersed in an etchant so that the divided edges of the devices are etched.

4 Claims, 7 Drawing Figures

METHOD OF MANUFACTURING SEMI-CONDUCTOR DEVICES

This invention relates to a method of manufacturing semi-conductor devices and particularly, but not exclusively, diodes and transistors.

A method, according to the invention, comprises the steps of:-
a. starting with a semi-conductor wafer having at least one n-type zone and at least one p-type zone,
b. applying an etchant resistant material to the major surfaces of the wafer,
c. dividing the wafer into individual devices by sawing or scribing part of the way through the wafer and then cracking the wafer along the grooves defined by the sawing or scribing operation, p-n junctions being exposed at the divided edges of the devices,
d. mounting the devices on an etchant resistant, adhesive tape with one major surface of each device being presented to the tape, and
e. immersing the tape, with the devices carried thereby, in an etchant so that the divided edges of the devices are etched.

Preferably, in step (c) the grooves produced by the sawing operation extend between 60% and 90% through the wafer.

Figure 5:
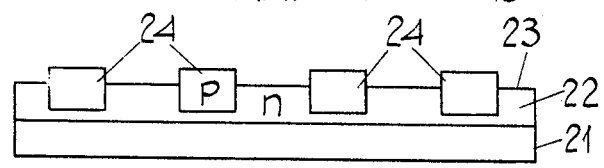
Figure 6:
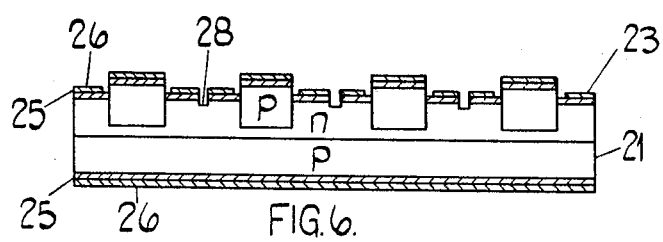
Figure 7:
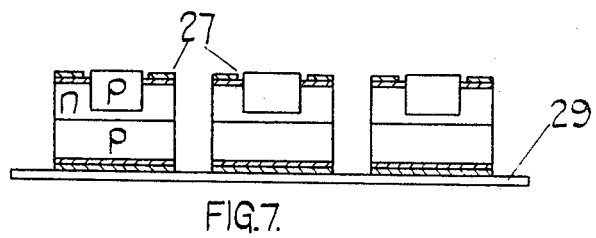

In the accompanying drawings,

FIGS. 1 to 4 are sectional views not to scale illustrating four stages respectively during a method according to a first example of the invention, and FIGS. 5 to 7 are sectional views not to scale illustrating three stages respectively during a method according to a second example of the invention.

Referring to FIGS. 1 to 4, in the first example semi-conductor diodes are produced from a silicon wafer 11 of p-type material, although it is to be appreciated that an n-type wafer could alternatively have been employed. The wafer 11 is first treated by known diffusion techniques to produce a p-n junction 12 adjacent one major surface 13 of the wafer 11. After the p-n junction has been formed, gold layers (not shown) are deposited onto the surfaces of the wafer to facilitate the making of subsequent electrical connections to the diodes to be produced. An etchant resistant material sold as XZ06 dark resist is then deposited over the surface 13 of the wafer to produce a 0.001 inches thick layer 14 which is then allowed to dry in air until tack-free. A layer 15 of a differently coloured etchant resistant material sold as PC762 light resist is then applied to the other major surface of the wafer 11, the thickness of the layer 15 also being 0.001 inches and the layer again being allowed to dry in air. Conveniently, the layers 14, 15 are produced by spraying onto the wafer a 50/50 mix of toluene with the particular resist. Moreover, it is to be appreciated that the use of differently coloured resists for the layers 14, 15 respectively facilitates identification of the n and p-type sides of the wafer 11.

Figure 1:
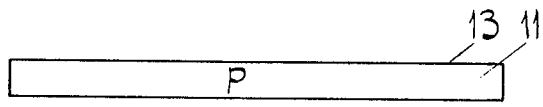
Figure 2:
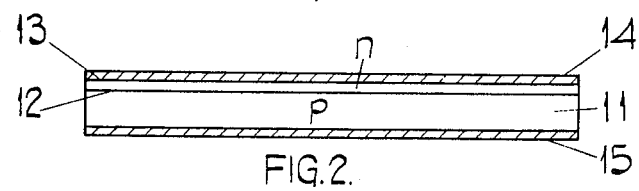
Figure 3:
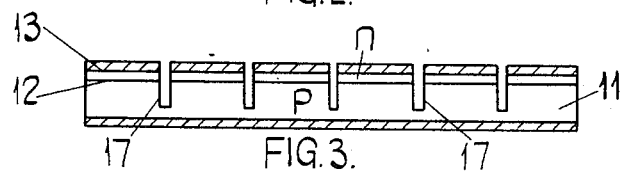
Figure 4:
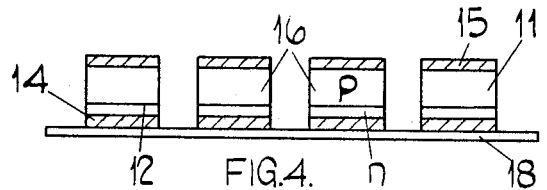

After formation of the layers 14, 15 the wafer 11 is heated in an oven for 5 minutes at between 80° and 100°C so as to cure the layers 14, 15. The wafer 11 is then divided into separate devices 16 (FIG. 4) of square or hexagonal configuration by a sawing operation followed by a cracking operation. Sawing is effected from the surface 13 of the wafer and is continued until the grooves 17 formed thereby extend between 60% and 90% through the wafer whereby, as shown in FIG. 3, p-n junctions are exposed in the grooves 17. The wafer 11 is subsequently cracked along the line of the grooves 17 to produce the required devices 16, which are then mounted on an etchant resistant, adhesive tape 18 with the surface 16 of each device being presented to the tape. Conveniently the tape 18 is that sold by Tesa Tapes Limited as Tesafilm 108 and the devices are arranged on the tape with a spacing of between 3/32 inches to ⅛ inches between adjacent devices. When the devices 16 are in position the tape 18 is immersed in an etching solution which is maintained at a temperature of between 15°C and 25°C and has the following composition by volume:

| | |
|---|---|
| Nitric acid | 5 parts |
| Hydrofluoric acid | 3 parts |
| Phosphoric acid | 3 parts. |

The tape 18 and devices 16 are retained in the etching solution for 3½ minutes, while the latter is gently agitated, so as to etch-polish the sawn edges of the devices, and in particular the exposed p-n junctions which tend to be damaged by the sawing operation.

When etching is complete, the tape 18 and devices 16 are removed from the etching solution and are washed in de-ionised water to remove any remaining etchant. The tape 18 with the devices thereon is then immersed in aqua-regia to remove any portions of the gold contact layers left overhanging the devices 16 after the etch-polishing operation, whereafter the tape 18 and devices 16 are washed in running water for 10 minutes. After washing, the assembly is blow dried with warm air and is then treated with a trichloroethylene spray to remove the layers 14, 15. The tape 18 is then soaked in trichloroethylene to allow the devices 16 to be removed from the tape 18 so that it will be appreciated that in this example the tape 18 must be trichloroethylene resistant as well as etchant resistant. Finally, the devices 16 are washed, dried and cleaned ultrasonically.

It is to be appreciated that the width of the grooves 17 produced by the sawing operation can be very small, e.g. 0.002 inches, so that it is possible to reduce to a minimum the amount of the wafer 11 which is removed in dividing the wafer into the individual devices 16. This therefore enables the maximum number of devices to be obtained from the wafer.

Referring to FIGS. 5 to 7, in the second example it is required to produce p-n-p transistors from a silicon wafer 21 of p-type material. It is of course to be appreciated that by employing an n-type wafer, n-p-n transistors could alternatively by produced. The wafer 21 is first treated by known diffusion and etching techniques to produce an n-type layer 22 at one major surface 23 of the wafer and a plurality of p-type layers 24 in, and projecting from, the layer 23. In the final transistors, the layers 22, 24 are to define the base and emitters respectively of the transistors, while the remainder of the wafer 21 is to define the collectors.

After formation of the layers 22, 24 both major surfaces of the wafer 21 are plated firstly with a layer 25 of nickel and then with a layer 26 of gold. The surface 23 of the wafer is then masked, whereafter the wafer is dipped in a gold etchant, the mask being arranged so that the gold layer 26 is removed from the p-n junctions between the layers 24, 22. Thereafter, the mask is removed and the surface 23 of the wafer is scribed between the layers 24. The wafer 21 is then divided into individual devices 27 by cracking the wafer along the line of the groove 28 produced by the scribing operation. The individual devices 27 are then mounted on an etchant resistant adhesive tape 29, which conveniently is that employed in the previous example, so that the surfaces 23 of the devices are uppermost. The tape 29 is them immersed in the etching solution of the previous example for 1¼ minutes, the etching solution again being agitated and being maintained at a temperature of between 15° and 25°C. The etching solution not only etches the divided edges of the devices 27 so as to clean the collector-base junctions, but also serves to etch the base-emitter junction so as to improve the characteristics of the devices.

I claim:
1. A method of manufacturing semi-conductor devices comprising the steps of:
   a starting with a semi-conductor wafer having at least one n-type zone and at least one p-zone,
   b applying an etchant resistant material to the major surfaces of the wafer,
   c dividing the wafer into individual devices by sawing or scribing part of the way through the wafer and then cracking the wafer along the grooves defined by the sawing or scribing operation, p-n junctions being exposed at the divided edges of the devices,
   d after step (c), mounting the individual devices on an etchant resistant, adhesive tape with one major surface of each device being presented to the tape, and then
   immersing the tape, with the devices carried thereby, in an etchant so that the divided edges of the devices are etched.
2. A method as claimed in claim 1 wherein, when the wafer is divided into individual devices by a sawing operation followed by a cracking operation, said grooves extend between 60% and 90% through the wafer.
3. A method as claimed in claim 2 wherein the devices are diodes.
4. A method as claimed in claim 1 wherein the devices are transistors and the wafer is divided into said devices by a scribing operation followed by a cracking operation.

* * * * *